United States Patent
Kwon et al.

(10) Patent No.: US 8,946,884 B2
(45) Date of Patent: Feb. 3, 2015

(54) SUBSTRATE-LESS INTERPOSER TECHNOLOGY FOR A STACKED SILICON INTERCONNECT TECHNOLOGY (SSIT) PRODUCT

(71) Applicant: Xilinx, Inc., San Jose, CA (US)

(72) Inventors: Woon-Seong Kwon, Cupertino, CA (US); Suresh Ramalingam, Fremont, CA (US); Namhoon Kim, Irvine, CA (US); Joong-Ho Kim, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/791,819

(22) Filed: Mar. 8, 2013

(65) Prior Publication Data

US 2014/0252599 A1  Sep. 11, 2014

(51) Int. Cl.
*H01L 23/12* (2006.01)
*H01L 23/48* (2006.01)
(Continued)

(52) U.S. Cl.
CPC .... *H01L 21/76802* (2013.01); *H01L 23/49811* (2013.01); *H01L 23/49822* (2013.01); *H01L 21/4857* (2013.01); *H01L 21/6835* (2013.01); *H05K 3/28* (2013.01); *H05K 3/4682* (2013.01); *H01L 23/3128* (2013.01); *H01L 21/568* (2013.01); *H01L 24/16* (2013.01); *H01L 24/81* (2013.01); *H01L 25/0655* (2013.01); *H01L 25/18* (2013.01); *H01L 2221/68359* (2013.01); *H01L 2221/68381* (2013.01); *H01L 2224/16225* (2013.01); *H01L 2224/81005* (2013.01); *H01L 2924/14* (2013.01); *H01L 2924/15311* (2013.01); *H01L 2924/18161* (2013.01)

USPC .......... 257/700; 257/693; 257/758; 257/759; 257/E21.575

(58) Field of Classification Search
USPC .......... 257/693, 700–703, E23.006, E23.011, 257/E23.062, E23.063, E23.172–E23.175, 257/E21.575, 698, 758, 759; 361/760, 761, 361/784
See application file for complete search history.

(56) References Cited

U.S. PATENT DOCUMENTS

| 6,803,324 B2 * | 10/2004 | Ogawa et al. ................. 438/761 |
| 2007/0096292 A1 * | 5/2007 | Machida ...................... 257/700 |
| 2011/0024176 A1 | 2/2011 | Ko |

FOREIGN PATENT DOCUMENTS

| KR | 2009 0070699 A | 7/2009 |
| KR | 10-2014-0060435 | 5/2014 |

OTHER PUBLICATIONS

Alapati, R. et al., "TSV metrology and inspection challenges," in *Proc. IEEE International Conference on 3D System Integration*, San Francisco, 2009, pp. 01-04.

(Continued)

*Primary Examiner* — Jasmine Clark
(74) *Attorney, Agent, or Firm* — John J. King

(57) ABSTRACT

A substrate-less interposer for a stacked silicon interconnect technology (SSIT) product, includes: a plurality of metallization layers, at least a bottom most layer of the metallization layers comprising a plurality of metal segments, wherein each of the plurality of metal segments is formed between a top surface and a bottom surface of the bottom most layer of the metallization layers, and the metal segments are separated by dielectric material in the bottom most layer; and a dielectric layer formed on the bottom surface of the bottom most layer, wherein the dielectric layer includes one or more openings for providing contact to the plurality of metal segments in the bottom most layer.

23 Claims, 8 Drawing Sheets

(51) Int. Cl.
| | |
|---|---|
| H01L 23/485 | (2006.01) |
| H01L 21/768 | (2006.01) |
| H01L 23/498 | (2006.01) |
| H01L 21/48 | (2006.01) |
| H01L 21/683 | (2006.01) |
| H05K 3/28 | (2006.01) |
| H05K 3/46 | (2006.01) |
| H01L 23/31 | (2006.01) |
| H01L 21/56 | (2006.01) |
| H01L 23/00 | (2006.01) |
| H01L 25/065 | (2006.01) |
| H01L 25/18 | (2006.01) |

(56) References Cited

OTHER PUBLICATIONS

Amanokura, J. et al., "Development of high speed Copper CMP slurry for TSV application based on friction analysis," in *Proc. 2010 IEEE CPMT Symposium Japan*, Tokyo, 2010, pp. 01-04.

Auer, H. et al., "Low COO PVD solutions addressing 2.5D and 3D TSV packaging challenges," *in Proc. 2012 35th IEEE/CPMT International Electronic Manufacturing Technology Symposium (IEMT)*, Malaysia, 2012, pp. 01-06.

Chew, J. et al., "Characterization and optimization of a TSV CMP reveal process using a novel wafer inspection technique for detecting sub-monolayer surface contamination," *in Proc. IEEE Intenational Conference on 3D System Integration*, San Francisco, 2013, pp. 01-06.

Choi, J. et al., "TSV Cu Filling Failure Modes and Mechanisms Causing the Failures," *IEEE Trans. Components, Packaging and Manufacturing Technology*, vol. 4, issue. 4, 2014, pp. 581-587.

Civale, Y. et al., "Enhanced barrier seed metallization for integration of high-density high aspect-ratio copper-filled 3D through-silicon via interconnects," in *Proc. 2009 IEEE 59rd Electronic Components and Technology Conference*, San Diego, 2009, pp. 822-826.

Dorsey, P. "Xilinx Stacked Silicon Interconnect Technology Delivers Breakthrough FPGA Capacity, Bandwidth, and Power Efficiency", Xilinx White paper: Virtex-7 FPGAs, WP380, V1.0, Oct. 27, 2010.

Guitett, P. et al., "Pre- and post-thinning silicon thickness mapping using a high throughput defect inspection system for advanced 3D IC packaging," in *Proc. 2012 IEEE 14th Electronics Packaging Technology Conference (EPTC)*, Singapore, 2012, pp. 614-618.

Halder, S. et al., "Metrology and inspection challenges for manufacturing 3D stacked IC's," in Proc. 2013 24th Annual SEMI Advanced Semiconductor Manufacturing Conference (ASMC), New York, 2013, pp. 75-79.

Hwang, B. et al., "Integration challenges of TSV backside via reveal process," in *Proc. 2013 IEEE 63rd Electronic Components and Technology Conference*, Las Vegas, 2013, pp. 915-917.

Kim, B. et al., "Factors affecting copper filling process within high aspect ratio deep vias for 3D chip stacking," in *Proc. 2006 IEEE 56rd Electronic Components and Technology Conference*, San Diego, 2012, pp. 838-843.

Kwon, W. et al., "Novel thinning/backside passivation for substrate coupling depression of 3D IC," in *Proc. 2011 IEEE 61rd Electronic Components and Technology Conference*, Florida, 2011, pp. 1395-1399.

Li, Y. et al., "Impact of barrier integrity on liner reliability in 3D through silicon vias," in *Proc. 2013 IEEE International Reliability Physics Symposium (IRPS)*, Monterey, 2013, pp. 5C.5.1-5C.5.5.

Mauer, L. et al., "Silicon Etch with integrated metrology for through silicon via (TSV) reveal," in *Proc. IEEE International Conference on 3D System Integration*, San Francisco, 2013, pp. 01-04.

Morikawa, Y., "Total cost effective scallop free Si etching for 2.5D & 3D TSV fabrication technologies in 300mm wafer," in *Proc. 2013 IEEE 63rd Electronic Components and Technology Conference*, Las Vegas, 2013, pp. 605-607.

Olsen, S. "Challenges in thin wafer handling and processing," in Proc. 2013 24th Annual SEMI Advanced Semiconductor Manufacturing Conference (ASMC),New York, 2013, pp. 62-65.

Olsen, S. et al., "TSV reveal etch for 3D integration," in *Proc. IEEE International Conference on 3D System Integration*, San Francisco, 2011, pp. 01-04.

Ouyang, Z. "Etching mechanism of the single-step through-silicon-via dry etch using SF6/C4F8 chemistry," Journal of Vacuum Science & Technology A: Vacuum, Surfaces, and Films, vol. 3, Issue.4, pp. 041306-041306-10.

Ranganathan, N. et al., "Influence of Bosch Etch Process on Electrical Isolation of TSV Structures," *IEEE Trans. Components, Packaging and Manufacturing Technology*, vol. 1, Issue. 10, Oct. 2011, pp. 1497-1507.

Raynal, F. et al., "Electrografted seed layers for metallization of deep TSV structures," in *Proc. 2009 IEEE 59rd Electronic Components and Technology Conference*, San Diego, 2012, pp. 1147-1152.

Roth, H. et al., "Inspection of through silicon vias (TSV) and other interconnections in IC packages by computed tomography," in *Proc. 3rd Electronic System-Integration Technology Conference (ESTC)*, Berlin, 2010, pp. 01-04.

Rudolph, C. "Influence of different anneal processes on copper surfaces pre- and post-CMP," in *Proc. International Conference on Planarization/CMP Technology (ICPT)*, Grenoble, 2012, pp. 01-06.

Saettler, P. et al., "Bath chemistry and copper overburden as influencing factors of the TSV annealing," in *Proc. 2013 IEEE 63rd Electronic Components and Technology Conference*, Las Vegas, 2013, pp. 1753-1758.

Teh, W. et al., "A route towards production-worthy 5 µm × 25 µm and 1 µm × 20 µm non-Bosch through-silicon-via via (TSV) etch, TSV metrology, and TSV integration," in *Proc. IEEE International Conference on 3D System Integration*, San Francisco, 2009, pp. 01-04.

Thomas, D. "Plasma etch and low temperature PECVD processes for via reveal applications," in *Proc. 2012 IEEE 62rd Electronic Components and Technology Conference*, San Diego, 2012, pp. 1662-1667.

Tsai, W. "How to select adhesive materials for temporary bonding and de-bonding of 200mm and 300mm thin-wafer handling for 3D IC integration?," in *Proc. 2011 IEEE 61rd Electronic Components and Technology Conference*, Florida, 2011, pp. 989-998.

Watanabe, N. et al., "Development of Cu-less TSV reveal process using Si/Cu grinding, electroless Ni plating, and alkaline etching of Si," in *Proc. 2012 IEEE 15th Electronics Packaging Technology Conference (EPTC)*, Singapore, 2013, pp. 702-705.

Wu, H. et al., "Study on copper plating solutions for fast filling of through silicon via (TSV) in 3D electronic packaging," *in Proc. 2011 6th International Microsystems, Packaging, Assembly and Circuits Technology Conference (IMPACT)*, Taipei, 2011, pp. 01-06.

Zhao, M. et al., "Demonstration of integrating post-thinning clean and TSV exposure recess etch into a wafer backside thinning process," in *Proc. 5th Electronic System-Integration Technology Conference (ESTC)*, Berlin, 2012, pp. 01-03.

Zoschke, K. et al., "Evaluation of thin wafer processing using a temporary wafer handling system as key technology for 3D system integration," in *Proc. 2010 IEEE 60rd Electronic Components and Technology Conference*, Las Vegas, 2010, pp. 1385-1392.

\* cited by examiner

SUBSTRATE-LESS INTERPOSER TECHNOLOGY FOR A STACKED SILICON INTERCONNECT TECHNOLOGY (SSIT) PRODUCT

FIELD OF THE INVENTION

An embodiment described herein relates generally to stacked silicon interconnect technology (SSIT) products, and in particular to a substrate-less interposer technology for an SSIT product.

BACKGROUND

Silicon stacked interconnect technology (SSIT) involves packaging multiple integrated circuit (IC) dies into a single package that includes an interposer and a package substrate. Utilizing SSIT expands IC products such as FPGAs into higher density, lower power, greater functionality, and application specific platform solutions with low cost and fast-to-market advantages.

Conventionally, SSIT products are implemented using an interposer that includes an interposer substrate layer with through-silicon-vias (TSVs) and additional metallization layers built on top of the interposer substrate layer. The interposer provides connectivity between the IC dies and the package substrate. However, fabricating the interposer substrate layer with TSVs for the SSIT products is a complex process. This is due to the several fabrication steps necessary to form the interposer substrate layer with the TSVs that include: forming TSVs within the interposer substrate layer, performing backside thinning and chemical vapor deposition (CVD) or chemical mechanical planarization (CMP), and providing thin wafer handling. Thus, forming SSIT products that includes an interposer having an interposer substrate layer with through-silicon-vias (TSVs) may be undesirable for certain applications.

SUMMARY

A substrate-less interposer for a stacked silicon interconnect technology (SSIT) product, includes: a plurality of metallization layers, at least a bottom most layer of the metallization layers comprising a plurality of metal segments, wherein each of the plurality of metal segments is formed between a top surface and a bottom surface of the bottom most layer of the metallization layers, and the metal segments are separated by dielectric material in the bottom most layer; and a dielectric layer formed on the bottom surface of the bottom most layer, wherein the dielectric layer includes one or more openings for providing contact to at least some of the plurality of metal segments in the bottom most layer.

Optionally, the plurality of metal segments may comprise copper.

Optionally, the substrate-less interposer may also include a passivation layer having one or more openings that correspond spatially with the one or more openings at the dielectric layer, wherein the passivation layer is formed on the dielectric layer.

Optionally, the substrate-less interposer may also include an underbump metal (UBM) layer in contact with the at least some of the plurality of metal segments in the bottom most layer, the UBM layer formed on the bottom most layer.

Optionally, the substrate-less interposer may be configured to support a plurality of IC dies on a top surface of a top most layer of the metallization layers.

Optionally, the plurality of IC dies may comprise heterogeneous IC dies.

Optionally, the plurality of IC dies may comprise homogeneous IC dies.

Optionally, different groups of the plurality of metal segments in the bottom most layer of the metallization layers may correspond respectively to a plurality of IC dies.

Optionally, the different groups of the plurality of metal segments may have different respective segment densities.

Optionally, each of the plurality of the metallization layers may comprise a plurality of metal segments, and a number of the metal segments in one of the metallization layers may be different from a number of the metal segments in another one of the metallization layers.

A method for forming a stacked silicon interconnect technology (SSIT) product with a substrate-less interposer, includes: forming a dielectric layer on a substrate; forming a plurality of metallization layers on the dielectric layer, at least a bottom most layer of the metallization layers comprising a plurality of metal segments, wherein each of the metal segments is formed between a top surface and a bottom surface of the bottom most layer of the metallization layers, and the metal segments are separated by dielectric material in the bottom most layer; placing a plurality of IC dies on a top surface of a top most metallization layer of the plurality of metallization layers; forming one or more openings at the dielectric layer for providing contact to at least some of the plurality of metal segments in the bottom most layer of the plurality of metallization layers, wherein the dielectric layer with the one or more openings and the plurality of metallization layers form the substrate-less interposer; and placing the substrate-less interposer on a package substrate for forming the SSIT product.

Optionally, the act of removing the substrate may include thinning the substrate using a mechanical grinding process, and removing the thinned substrate using an etching process.

Optionally, the plurality of IC dies may comprise heterogeneous IC dies.

Optionally, the plurality of IC dies may comprise homogeneous IC dies.

Optionally, the method may further include securing the substrate-less interposer on the package substrate to form the SSIT product using C4 bumps.

Optionally, the method may further include forming a passivation layer on the dielectric layer after forming the one or more openings at the dielectric layer, wherein the passivation layer includes one or more openings that correspond spatially with the one or more openings at the dielectric layer, and wherein the substrate-less interposer further includes the passivation layer.

Optionally, the method may further include forming an underbump metal (UBM) layer on the bottom most layer of the one or more metallization layers, wherein the under bump metal layer is in contact with the at least some of the plurality of metal segments in the bottom most layer of the one or more metallization layers, and wherein the substrate-less interposer further includes the UBM layer.

Optionally, different groups of the plurality of metal segments in the bottom most layer of the one or more metallization layers may correspond to respective ones of the plurality of IC dies.

Optionally, the different groups of the plurality of metal segments may have different respective segment densities.

Optionally, each of the plurality of the metallization layers may comprise a plurality of metal segments, and a number of the metal segments in one of the metallization layers may be different from a number of the metal segments in another one of the metallization layers.

Other and further aspects and features will be evident from reading the following detailed description.

BRIEF DESCRIPTION OF THE DRAWINGS

The drawings illustrate the design and utility of various features described herein, in which similar elements are referred to by common reference numerals. These drawings are not necessarily drawn to scale. In order to better appreciate how the above-recited and other advantages and objects are obtained, a more particular description will be rendered, which are illustrated in the accompanying drawings. These drawings depict only exemplary features and are not therefore to be considered limiting in the scope of the claims.

FIGS. 4-1 to 4-9 are cross-sectional schematic diagrams illustrating a method for fabricating a SSIT product that utilizes a substrate-less interposer technology.

DETAILED DESCRIPTION

Figure 1:
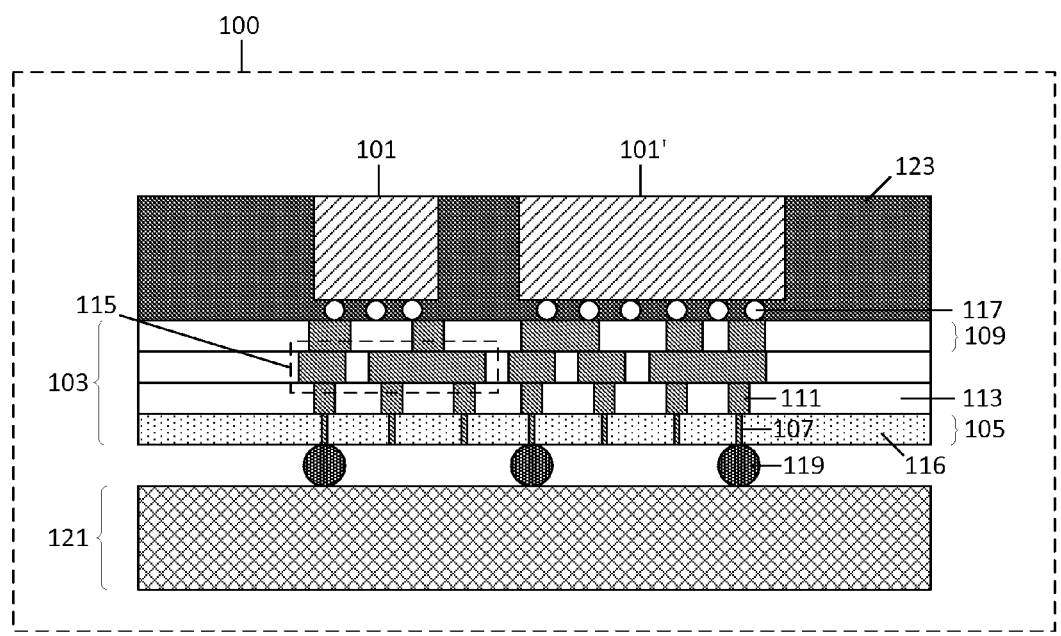
FIG. 1 is a cross-sectional schematic diagram illustrating a stacked silicon interconnect technology (SSIT) product that utilizes an interposer that includes an interposer substrate layer with through-silicon-vias.

Various features are described hereinafter with reference to the figures. It should be noted that the figures are not drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated.

Silicon stacked interconnect technology (SSIT) involves packaging multiple integrated circuit (IC) dies into a single package that includes an interposer and a package substrate. Utilizing SSIT expands IC products, such as and including FPGA products and other types of products, into higher density, lower power, greater functionality, and application specific platform solutions with low cost and fast-to-market advantages.

FIG. 1 is a cross-sectional schematic diagram illustrating a stacked silicon interconnect technology (SSIT) product 100. The SSIT product 100 includes a package substrate 121, an interposer 103, and one or more IC dies 101, 101'.

The integrated circuit dies 101, 101' may be functionally connected to the interposer 103 via one or more microbumps 117. The integrated circuit dies 101, 101' may be encapsulated using a mold encapsulation 123. The mold encapsulation 123 provides protection against environmental factors (e.g., temperature, external contaminants, etc.) that may affect performance of the integrated circuit dies 101, 101'. Additionally, the mold encapsulation 123 provides mechanical stability to the integrated circuit dies 101, 101'.

The interposer 103 includes a plurality of metallization layers 109 and an interposer substrate layer 105 with through-silicon-vias (TSVs) 107.

Each metallization layer 109 may include a plurality of metal segments 111 separated by dielectric material 113. The metal segments may be composed of copper or any number of other types of metal. The dielectric material 113 may be composed of silicon dioxide or any other dielectric material. Each metallization layer 109 may include different groups 115 of metal segments 111 that correspond to different IC dies 101, 101'. For example, a metallization layer 109 may include a first group of metal segments that correspond to a first IC die 101 and a second group of metal segments that correspond to a second IC die 101'. Additionally, each different group 115 of metal segments 111 may have a different density. For example, a metallization layer 109 may include a first group 115 of metal segments 111 that have a particular number of metal segments (i.e., segment density) and a second group 115 of metal segments 111 that have a different number of metal segments (i.e., segment density). A group 115 may include only one metal segment 111 or a plurality of metal segments 111.

The interposer substrate layer 105 includes a number of TSVs 107. The interposer 103 provides connectivity between the IC dies 101, 101' and the package substrate 121 via one or more C4 bumps 119.

The interposer 103, including the plurality of metallization layer 109 and the interposer substrate layer 105 with TSVs 107, provides connectivity between the IC dies 101, 101' and the package substrate 121, as well as mechanical stability for the SSIT product 100. However, the complexity involved with fabricating the interposer substrate layer 105 with TSVs 107 for the SSIT product 100 may be very high. This is due to several fabrication steps necessary to form the interposer substrate layer 105 with the TSVs 107 that include: forming TSVs 107 within the interposer substrate 116, performing backside thinning and chemical vapor deposition (CVD) or chemical mechanical planarization (CMP), and providing thin wafer handling. Thus, forming SSIT products 100 that include an interposer 103 having an interposer substrate layer 105 with through-silicon-vias (TSVs) 107 may be undesirable for certain applications By utilizing an interposer that does not implement an interposer substrate layer with through-silicon-vias, a simpler fabrication process may be realized while maintaining high density interconnections for certain applications including cost-sensitive small form-factor devices.

Figure 2:
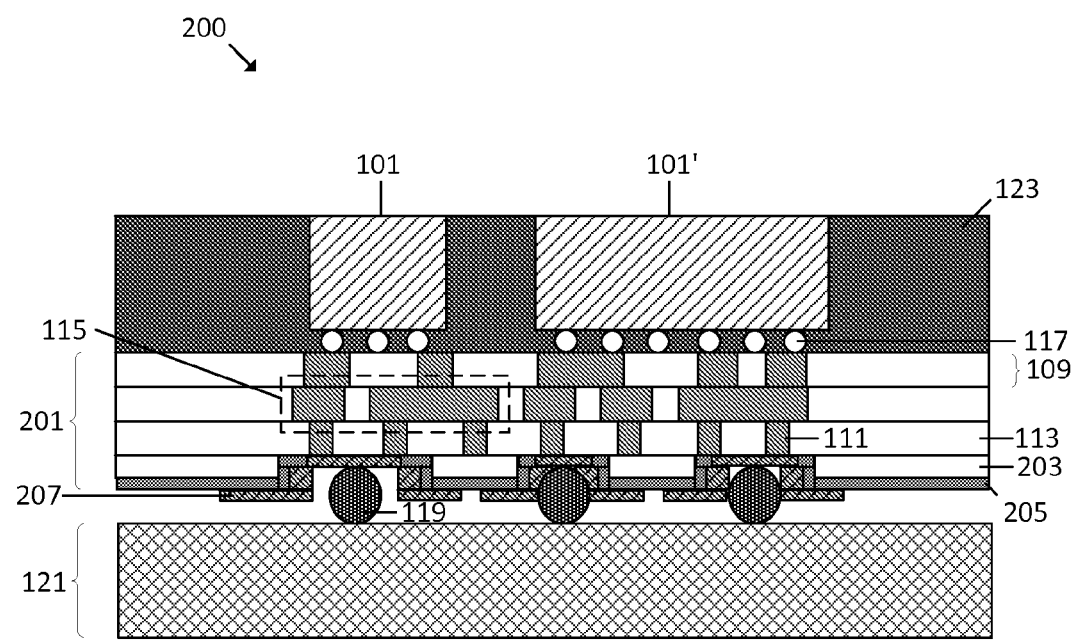
FIG. 2 is a cross-sectional schematic diagram illustrating a SSIT product that utilizes a substrate-less interposer technology.

FIG. 2 is a cross-sectional schematic diagram illustrating a SSIT product that utilizes a substrate-less interposer technology. The SSIT product 200 of FIG. 2 includes a package substrate 121, a substrate-less interposer 201, and one or more IC dies 101, 101'.

The integrated circuit dies 101, 101' may be functionally connected to the substrate-less interposer 201 via one or more microbumps 117. The integrated circuit dies 101, 101' may be encapsulated using a mold encapsulation 123. The mold encapsulation 123 provides protection against environmental factors (e.g., temperature, external contaminants, etc.) that may affect performance of the integrated circuit dies 101, 101'. Additionally, the mold encapsulation 123 provides mechanical stability to the integrated circuit dies 101, 101'.

In some cases, the integrated circuit dies 101, 101' may be heterogeneous IC dies. For example, a first IC die 101 may perform a different functionality and have different specifications than a second IC die 101'. In other cases, the integrated circuit dies 101, 101' may be homogenous IC dies. For example, a first IC die 101 may perform the same functionality and have the same specifications as a second IC die 101'.

The substrate-less interposer 201 includes a plurality of metallization layers 109. Each metallization layer 109 may include a plurality of metal segments 111 separated by dielectric material 113. The metal segments may be composed of copper or any number of other types of metal. The dielectric material 113 may be composed of silicon dioxide or any other dielectric material.

Each metallization layer 109 may include different groups 115 of metal segments 111 that correspond to different IC dies 101, 101'. For example, a metallization layer 109 may include a first group of metal segments that correspond to a first IC die 101 and a second group of metal segments that correspond to a second IC die 101'. A group 115 may include only one metal segment 111 or a plurality of metal segments 111. While only two different groups 115 of metal segments 111 are illustrated in FIG. 2, one ordinarily skilled in the art will recognize that any number of different groups 115 of metal segments 111 may be used depending on the particular application of the SSIT product 200.

Additionally, each different group 115 of metal segments 111 may have a different segment density. For example, a metallization layer 109 may include a first group 115 of metal segments 111 that have a particular number of metal segments 111 (i.e., segment density) and a second group 115 of metal segments 111 that have a different number of metal segments 111 (i.e., segment density). The segment density of each different group 115 of metal segments 111 in each metallization layer 109 may be based on the configuration of IC dies 101, 101' for the SSIT product 200. For example, a first group 115 of metal segments 111 of a metallization layer that corresponds to a first IC die with a small number of connections may have a lesser segment density than a second group 115 of metal segments 111 of the metallization layer that corresponds to a second IC die with a larger number of connects. The segment density for groups of metal segments 111 in different metallization layers 109 that correspond to the same IC die need not be the same.

In the illustrated figure, a number of the metal segments in one (e.g., the center one) of the metallization layers 109 is different from a number of the metal segments 111 in another one (e.g., the bottom most layer 109) of the metallization layers 109. Alternatively, two or more of the metallization layers 109 may have the same number of metal segments 111.

The substrate-less interposer 201 also includes a dielectric layer 203. The dielectric layer 203 is formed on the bottom surface of a bottom most layer of the metallization layers 109 and includes one or more openings for providing contact to the plurality of metal segments 111 in the bottom most layer of the metallization layers 109. The dielectric layer 203 may be composed of silicon dioxide or any other suitable dielectric material.

In some cases, a passivation layer 205 may be formed on the dielectric layer 203. The passivation layer 205 may also include one or more openings for providing contacts to the plurality of metal segments 111 in the bottom most layer of the metallization layers 109. The purpose of the passivation layer 205 is to provide stress buffering during handling of the SSIT product 200. The passivation layer 205 may be composed of an organic polyimide or any other suitable material.

In some cases, an under bump metal layer 207 may be formed on a bottom surface of the bottom most layer of the metallization layers 109 where the dielectric layer 203 and passivation layer 205 have openings. The under bump metal layer 207 is in contact with the metal segments 111 in the bottom most layer of the metallization layers 109 and provides connecting points/regions for connecting the interposer 201 to the package substrate 121.

One or more C4 bumps 119 may provide connectivity between the package substrate 121 and the substrate-less interposer 201. The C4 bumps 119 may be formed between the under bump metal layer 207 and a pad (not shown) of the package substrate 121.

By utilizing a substrate-less interposer that does not implement an interposer substrate layer with through-silicon-vias, a simpler fabrication process may be realized while maintaining high density interconnections for certain applications including cost-sensitive small form-factor devices.

Figure 3:
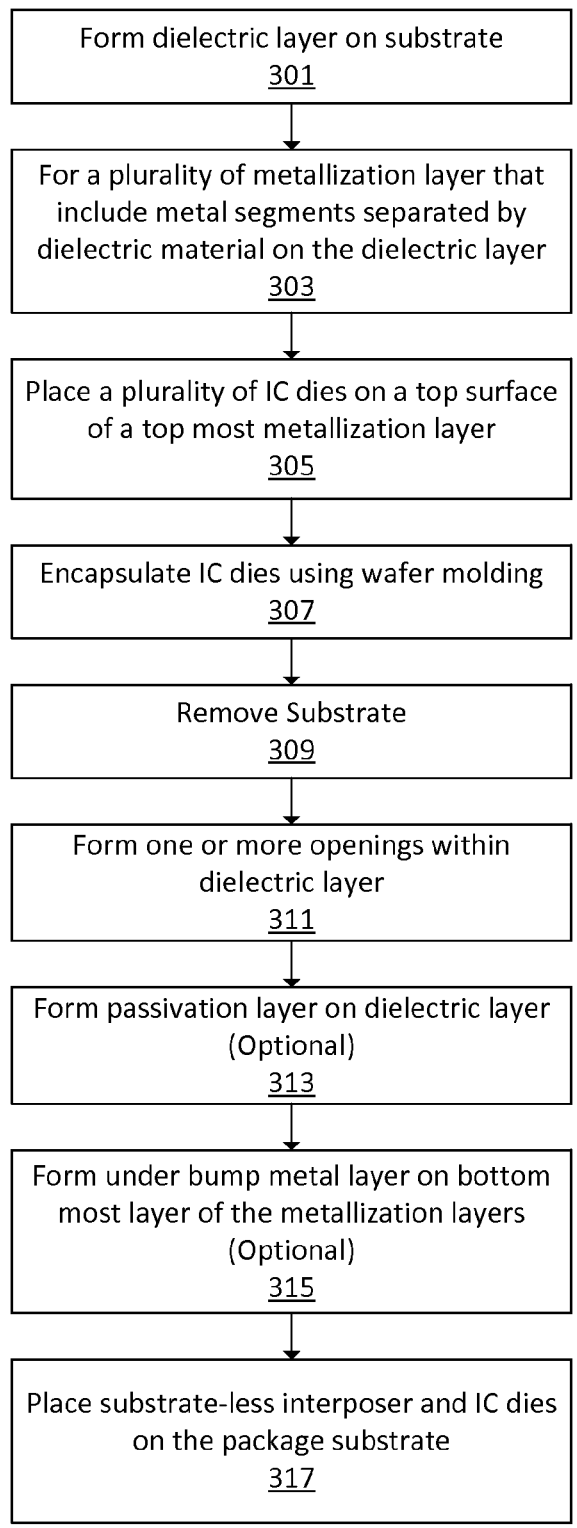
FIG. 3 is a flow diagram illustrating a method for fabricating a SSIT product that utilizes a substrate-less interposer technology.

FIG. 3 is a flow diagram illustrating a method for fabricating a SSIT product that utilizes a substrate-less interposer technology. FIG. 3 should be viewed in conjunction with FIGS. 4-1 to 4-9 which are cross-sectional schematic diagrams illustrating a method for fabricating a SSIT product that utilizes a substrate-less interposer technology.

Initially, a dielectric layer is formed on a substrate as shown at item 301. The dielectric layer may be composed of silicon dioxide or any other suitable dielectric material. The dielectric layer may be formed using any number of different deposition techniques.

Figures 1, 4:
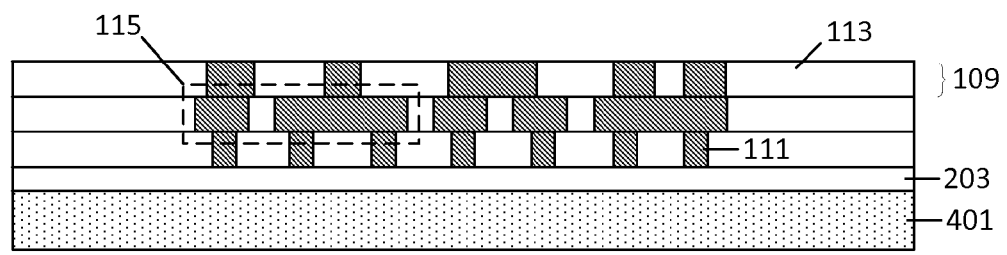
Figures 2, 4:
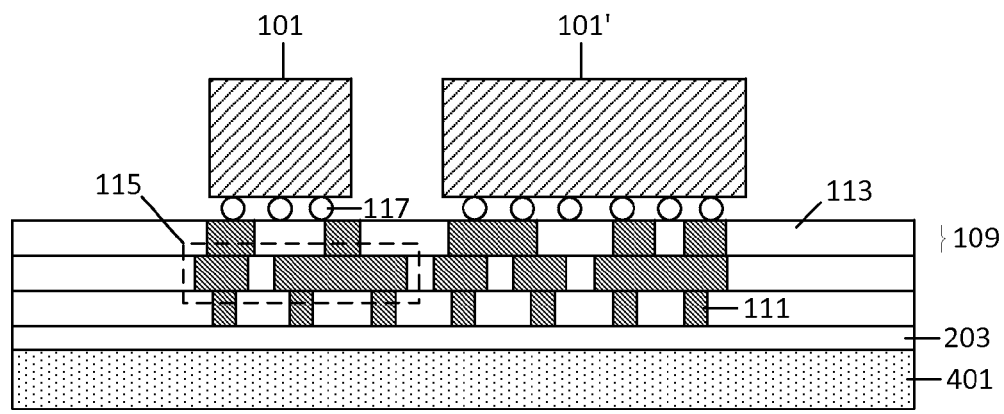
Figures 3, 4:
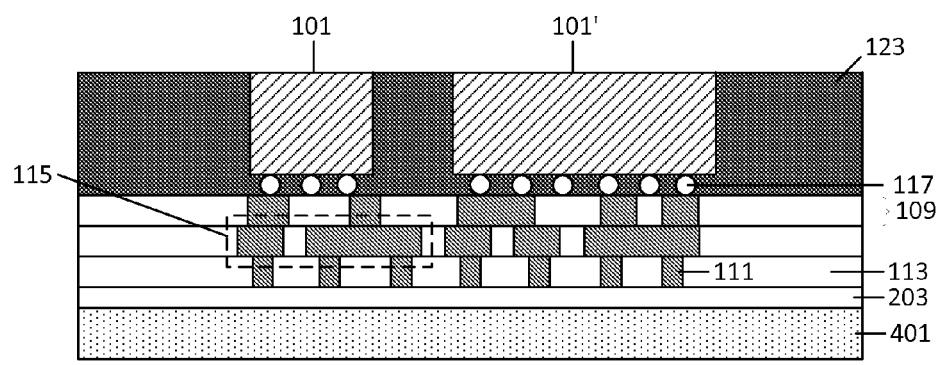
Figure 4:
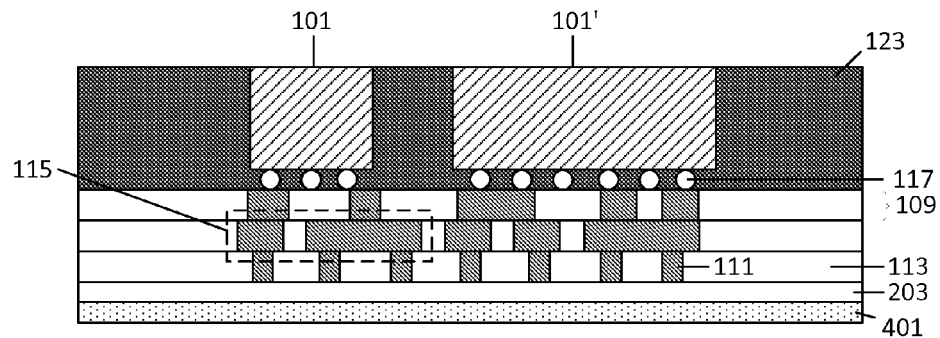

Once the dielectric layer is formed, a plurality of metallization layers that include metal segments separated by dielectric material is formed on the dielectric layer as shown at item 303. A cross-sectional view depicting the end result of items 301 and 303 is shown in FIG. 4-1. In particular, FIG. 4-1 illustrates a dielectric layer 203 formed on a substrate 401 (which is resulted from item 301). Also, there are a plurality of metallization layers 109 formed on the dielectric layer 203 (which is resulted from item 303). The metallization layers 109 includes metal segments 111, which may be composed of copper or any number of other types of metal. The dielectric material 203 may be composed of silicon dioxide or any other dielectric material.

Each metallization layer 109 may include different groups 115 of metal segments 111 that correspond to different IC dies. For example, a metallization layer 109 may include a first group 115 of metal segments 111 that correspond to a first IC die, and a second group 115 of metal segments 111 that correspond to a second IC die. It is important to note that any number of different groups 115 of metal segments 111 may be used depending on the particular application of the SSIT product to be formed.

Additionally, each different group 115 of metal segments 111 may have a different segment density. For example, a metallization layer 109 may include a first group of metal segments 111 that have a particular number of metal segments 111 (i.e., segment density) and a second group 115 of metal segments 111 that have a different number of metal segments 111 (i.e., segment density). The segment density of each different group 115 of metal segments 111 in each metallization layer 109 may be based on the configuration of IC dies for the SSIT product to be formed. For example, a first group 115 of metal segments 111 of a metallization layer 109 that corresponds to a first IC die with a small number of connections may have a lesser segment density than a second group 115 of metal segments 111 of the metallization layer 109 that corresponds to a second IC die with a larger number of connects. The segment densities for groups 115 of metal segments 111 in different metallization layers 109 that correspond to the same IC die need not be the same (i.e., they may be the same or different).

Returning to FIG. 3, next, a plurality of IC dies may then be placed on a top surface of a top most metallization layer as shown at item 305. A cross-sectional view depicting the end result of this fabrication process is shown in FIG. 4-2. In the illustrated figure, the plurality of IC dies 101, 101' may be placed such that they are connected to metal segments 111 of the top most metallization layer 109 via microbumps 117.

In some cases, the integrated circuit dies 101, 101' may be heterogeneous IC dies. For example, a first IC die 101 may perform a different functionality and have different specifications than a second IC die 101'. In other cases, the integrated circuit dies 101, 101' may be homogenous IC dies. For example, a first IC die 101 may perform the same functionality and have the same specifications as a second IC die 101'.

Returning to FIG. 3, next, the IC dies may be encapsulated using wafer molding as shown at item 307. A cross-sectional view depicting the end result of this fabrication step is shown in FIG. 4-3. In the illustrated figure, the mold encapsulation 123 encapsulates the IC dies 101, 101'. The mold encapsulation 123 provides protection against environmental factors (e.g., temperature, external contaminants, etc.) that may affect performance of the IC dies 101, 101'. Additionally, the mold encapsulation 123 provides mechanical stability to the IC dies 101, 101'.

Figures 4, 5:
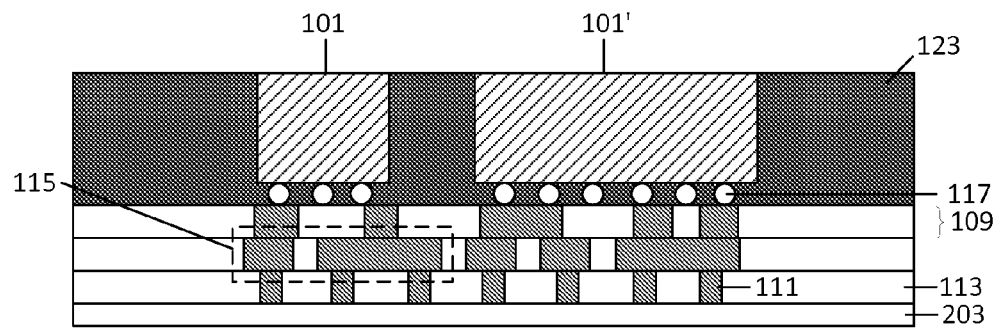

Returning to FIG. 3, next, the substrate may then be removed as shown at item 309. Removal of the substrate may be a two-part process. The substrate may first be thinned down using a mechanical grinding/polishing procedure. In some embodiments the substrate may be thinned down anywhere from 20 to 50 μm. A cross-sectional view depicting the end result of thinning down the substrate 401 is shown in FIG. 4-4. After thinning down the substrate 401, the thinned substrate 401 may then be removed using a highly selective silicon etching process. A cross-sectional view depicting the end result of removing the substrate 401 is shown in FIG. 4-5.

Figures 4, 5, 6:
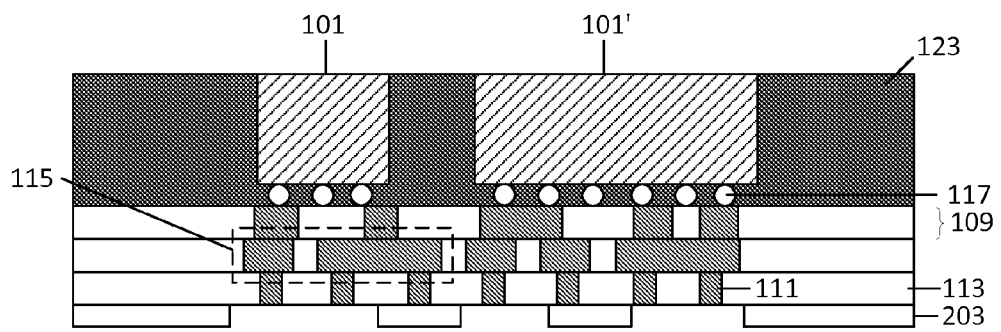
Figures 4, 5, 6, 7:
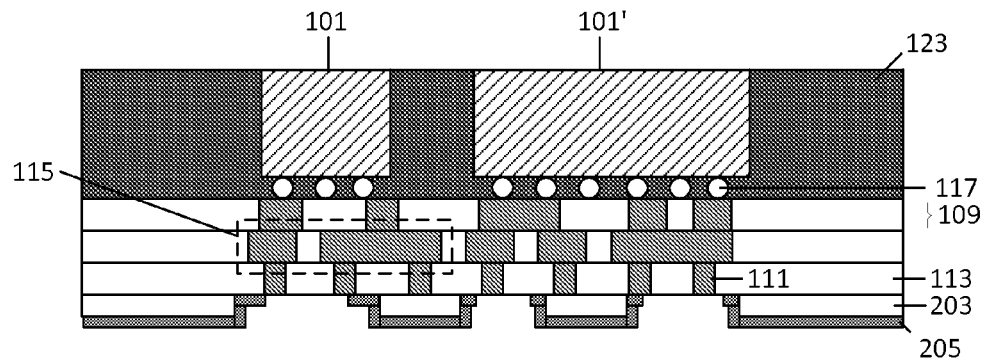
Figures 4, 5, 6, 7, 8:
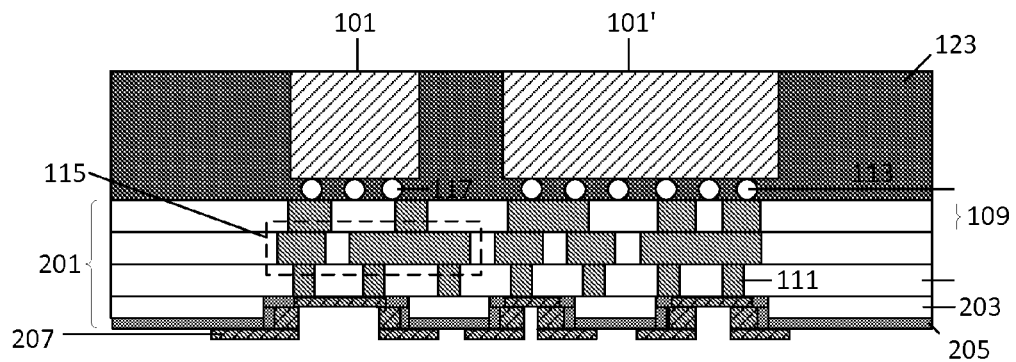
Figures 4, 5, 6, 7, 8, 9:
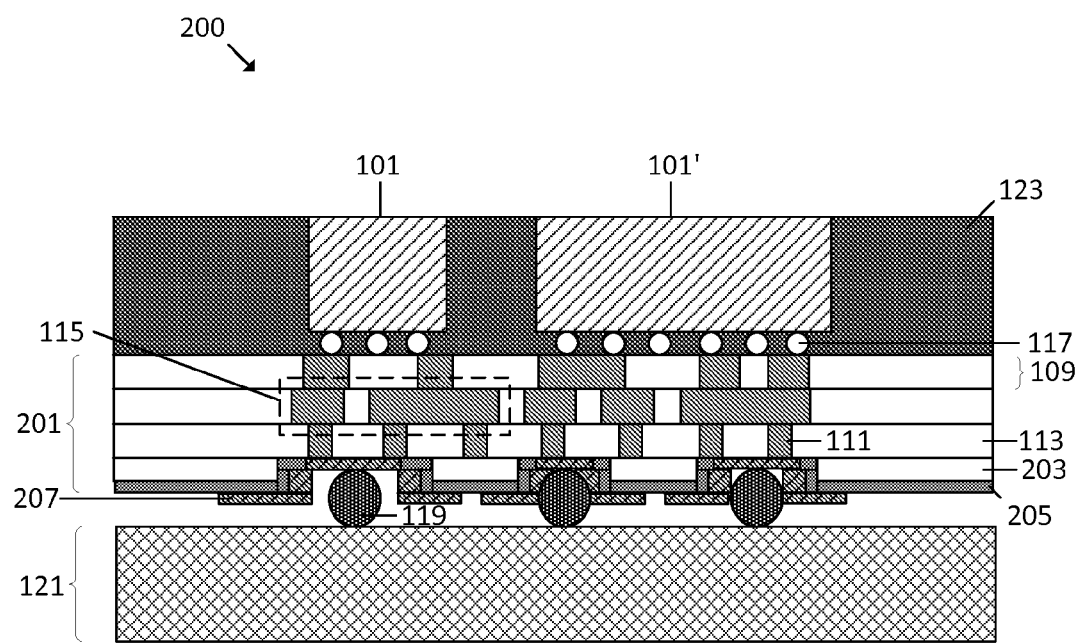

Returning to FIG. 3, next, after the substrate 401 is removed, one or more openings may be formed at the dielectric layer as shown at item 311. A cross-sectional view depicting the end result of forming the one or more openings is shown in FIG. 4-6. The one or more openings formed at the dielectric layer 203 extend through the dielectric layer 203, and provide contact to the plurality of metal segments 111 in a bottom most layer 109 of the metallization layers 109. The one or more openings may be formed using a highly selective silicon etching process.

Returning to FIG. 3, after the one or more openings have been formed in the dielectric layer 203, a passivation layer may optionally be formed on the dielectric layer 203 as shown at item 313. A cross-sectional view depicting the end result of forming the passivation layer 205 is shown in FIG. 4-7. The passivation layer 205 may also include one or more openings that spatially correspond with the one or more openings at the dielectric layer 203 for providing contacts to the plurality of metal segments 111 in the bottom most layer 109 of the metallization layers 109. The purpose of the passivation layer 205 is to provide stress buffering during handling of the SSIT product to be formed. The passivation layer 205 may be composed of an organic polyimide or any other suitable material.

Returning to FIG. 3, after the passivation layer 205 has been formed on the dielectric layer 203, an under bump metal layer may optionally be formed on the bottom most layer 209 of the metallization layers 209 as shown at item 315. A cross-sectional view depicting the end result of forming the under bump metal layer 207 is shown in FIG. 4-8. The under bump metal layer 207 may be formed on a bottom surface of the bottom most layer 109 of the metallization layers 109 where the dielectric layer 203 and passivation layer 205 have openings. The under bump metal layer 207 is in contact with the metal segments 111 in the bottom most layer 109 of the metallization layers 109 and provides a point/region for later connecting the interposer to the package substrate.

In the illustrated figure, the plurality of metallization layers 109, the dielectric layer 203, the passivation layer 205, and under bump metal layer 207, together form the substrate-less interposer 201. In some cases where the passivation layer 205 and/or the under bump metal layer 207 is not formed, the substrate-less interposer 201 would be formed by the plurality of metallization layers 109 and the dielectric layer 203.

Returning to FIG. 3, once the under bump metal layer 207 has been formed, the substrate-less interposer 201 and IC dies 101, 101' may be placed on the package substrate to form the SSIT product as shown at item 317. A cross-sectional view depicting the end result of placing the substrate-less interposer 201 and IC dies 101, 101' on the package substrate 121 is shown in FIG. 4-9. One or more C4 bumps 119 may be used to place the substrate-less interposer 201 and IC dies 101, 101' in contact with the package substrate 121. The C4 bumps 119 provide connectivity between the package substrate 121 and the substrate-less interposer 201. The C4 bumps 119 may be formed between the under bump metal layer 207 and a pad (not shown) of the package substrate 121.

As already mentioned above, by utilizing a substrate-less interposer that does not implement an interposer substrate layer with through-silicon-vias, a simpler fabrication process may be realized while maintaining high density interconnections for certain applications including, for example, cost-sensitive small form-factor devices.

It should be noted that the term "on", as used in this specification, may refer to directly on, or indirectly on. For example, when the dielectric layer is described as being formed "on" the bottom surface of the bottom most metallization layer, the dielectric layer may be either directly on (e.g., abutting) the bottom surface of the bottom most metallization layer, or indirectly on the bottom surface (e.g., the dielectric layer may be on another layer that is between the dielectric layer and the bottom most metallization layer). As another example, when the IC die(s) is described as being "on" the top surface of the top most metallization layer, the IC die(s) may be either directly on (e.g., abutting) the top surface of the top most metallization layer, or indirectly on the top surface (e.g., the IC die(s) may be on another layer that is between the IC die(s) and the top most metallization layer).

Also, as used in this specification, the term "plurality" may refer to two or more items. For example, a "plurality" of metallization layers may refer to two or more metallization layers, which may or may not be all of the available metallization layers. Accordingly, the phrase "each of the plurality" of metallization layers may refer to each of two or more metallization layers, which may or may not be all of the available metallization layers.

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications and equivalents.

What is claimed is:

1. A substrate-less interposer for a stacked silicon interconnect technology (SSIT) product, comprising:
   a plurality of metallization layers, at least a bottom most layer of the metallization layers comprising a plurality of metal segments, wherein each of the plurality of metal segments is formed between a top surface and a bottom surface of the bottom most layer of the metallization layers, and the metal segments are separated by dielectric material in the bottom most layer;

a dielectric layer formed on the bottom surface of the bottom most layer, wherein the dielectric layer includes one or more openings for providing contact to at least some of the plurality of metal segments in the bottom most layer; and a passivation layer having one or more openings that correspond spatially with the one or more openings at the dielectric layer, wherein the passivation layer is formed on the dielectric layer.

2. The substrate-less interposer of claim 1, wherein the plurality of metal segments comprise copper.

3. The substrate-less interposer of claim 1, further comprising an underbump metal (UBM) layer in contact with the at least some of the plurality of metal segments in the bottom most layer, the UBM layer formed on the bottom most layer.

4. The substrate-less interposer of claim 1, wherein the substrate-less interposer is configured to support a plurality of IC dies on a top surface of a top most layer of the metallization layers.

5. The substrates-less interposer of claim 4, wherein the plurality of IC dies comprises heterogeneous IC dies.

6. The substrate-less interposer of claim 4, wherein the plurality of IC dies comprises homogeneous IC dies.

7. The substrate-less interposer of claim 4, wherein different groups of the plurality of metal segments in the bottom most layer of the metallization layers correspond respectively to a plurality of IC dies.

8. The substrate-less interposer of claim 7, wherein the different groups of the plurality of metal segments have different respective segment densities.

9. The substrate-less interposer of claim 1, wherein each of the plurality of the metallization layers comprises a plurality of metal segments, and a number of the metal segments in one of the metallization layers is different from a number of the metal segments in another one of the metallization layers.

10. A substrate-less interposer for a stacked silicon interconnect technology (SSIT) product, comprising:
    a plurality of metallization layers, at least a bottom most layer of the metallization layers comprising a plurality of metal segments, wherein each of the plurality of metal segments is formed between a top surface and a bottom surface of the bottom most layer of the metallization layers, and the metal segments are separated by dielectric material in the bottom most layer;
    a dielectric layer formed on the bottom surface of the bottom most layer, wherein the dielectric layer includes one or more openings for providing contact to at least some of the plurality of metal segments in the bottom most layer;
    wherein the substrate-less interposer is configured to support a plurality of IC dies on a top surface of a top most layer of the metallization layers; and
    wherein different groups of the plurality of metal segments in the bottom most layer of the metallization layers correspond respectively to a plurality of IC dies.

11. The substrate-less interposer of claim 10, wherein the plurality of metal segments comprise copper.

12. The substrate-less interposer of claim 10, further comprising an underbump metal (UBM) layer in contact with the at least some of the plurality of metal segments in the bottom most layer, the UBM layer formed on the bottom most layer.

13. The substrates-less interposer of claim 10, wherein the plurality of IC dies comprises heterogeneous IC dies.

14. The substrate-less interposer of claim 10, wherein the plurality of IC dies comprises homogeneous IC dies.

15. The substrate-less interposer of claim 10, wherein the different groups of the plurality of metal segments have different respective segment densities.

16. The substrate-less interposer of claim 10, wherein each of the plurality of the metallization layers comprises a plurality of metal segments, and a number of the metal segments in one of the metallization layers is different from a number of the metal segments in another one of the metallization layers.

17. A substrate-less interposer for a stacked silicon interconnect technology (SSIT) product, comprising:
    a plurality of metallization layers, at least a bottom most layer of the metallization layers comprising a plurality of metal segments, wherein each of the plurality of metal segments is formed between a top surface and a bottom surface of the bottom most layer of the metallization layers, and the metal segments are separated by dielectric material in the bottom most layer;
    a dielectric layer formed on the bottom surface of the bottom most layer, wherein the dielectric layer includes one or more openings for providing contact to at least some of the plurality of metal segments in the bottom most layer;
    wherein each of the plurality of the metallization layers comprises a plurality of metal segments; and
    wherein a number of the metal segments in one of the metallization layers is different from a number of the metal segments in another one of the metallization layers.

18. The substrate-less interposer of claim 17, wherein the plurality of metal segments comprise copper.

19. The substrate-less interposer of claim 17, further comprising an underbump metal (UBM) layer in contact with the at least some of the plurality of metal segments in the bottom most layer, the UBM layer formed on the bottom most layer.

20. The substrate-less interposer of claim 17, wherein the substrate-less interposer is configured to support a plurality of IC dies on a top surface of a top most layer of the metallization layers.

21. The substrates-less interposer of claim 20, wherein the plurality of IC dies comprises heterogeneous IC dies.

22. The substrate-less interposer of claim 20, wherein the plurality of IC dies comprises homogeneous IC dies.

23. A substrate-less interposer for a stacked silicon interconnect technology (SSIT) product, comprising:
    a plurality of metallization layers, at least a bottom most layer of the metallization layers comprising a plurality of metal segments, wherein each of the plurality of metal segments is formed between a top surface and a bottom surface of the bottom most layer of the metallization layers, and the metal segments are separated by dielectric material in the bottom most layer; and
    a dielectric silicon dioxide layer formed on the bottom surface of the bottom most layer, wherein the dielectric silicon dioxide layer includes one or more openings for providing contact to at least some of the plurality of metal segments in the bottom most layer.

* * * * *